United States Patent [19]
Brown et al.

[11] Patent Number: 5,789,933
[45] Date of Patent: Aug. 4, 1998

[54] METHOD AND APPARATUS FOR DETERMINING IDDQ

[75] Inventors: Charles Allen Brown; Don R. Wiseman, both of Corvallis, Oreg.

[73] Assignee: Hewlett-Packard Co., Palo Alto, Calif.

[21] Appl. No.: 741,879

[22] Filed: Oct. 30, 1996

[51] Int. Cl.$^6$ ................................................ G01R 31/26
[52] U.S. Cl. ................................................ 324/765; 324/769
[58] Field of Search ................................ 324/769, 768, 324/754, 158.1, 765; 327/401; 371/22.5

[56] References Cited

U.S. PATENT DOCUMENTS

| | | | |
|---|---|---|---|
| 5,519,333 | 5/1996 | Righter | 324/765 |
| 5,552,744 | 9/1996 | Burlison et al. | 327/401 |
| 5,557,620 | 9/1996 | Miller, Jr. et al. | 371/22.5 |

OTHER PUBLICATIONS

"A General Purpose IDDQ Measurement Circuit", by: Kenneth M. Wallquist, Alan W. Righter, and Charles F. Hawkins, Aug. 1993, IEEE, Paper 31.3, International Test Conference 1993, pp. 642–651.

"Achieving IDDQ/ISSQ Production Testing With QuiC-Mon", by: Kenneth M. Wallquist –Philips Semiconductor, 1995, IEEE, IEEE Design & Test of Computers, pp. 62–69. Month unavailable.

"A New Approach To Dynamic IDD Testing", by: Mike Keating, GerRAd Inc. & Dennis Meyer, Catec Inc., 1987, IEEE, 1987 International Test Conference, Paper 13.3, pp. 316–321, Feb. 1987.

"HP83000 Digital IC Test System—F330 User Training, Model F330", by: Hewlett–Packard Company, Printed in the Federal Republic of Germany, Sep. 1994, Revision 0.95.

*Primary Examiner*—Ernest F. Karlsen
*Assistant Examiner*—Anh Phung
*Attorney, Agent, or Firm*—Raymond A. Jenski

[57] ABSTRACT

IDDQ of an integrated circuit is rapidly measured with system test equipment providing sampled pass/fail outputs. A switch couples the power supply to the integrated circuit and another switch returns a sense signal input to the integrated circuit such that the power may be interrupted to measure the decay of the voltage across the integrated circuit. A monitor signal output is coupled to the integrated circuit to enable monitoring of the voltage decay. At least one processor, which periodically samples the voltage signal, compares the magnitude of the voltage signal at the time of each said periodic sample to a predetermined reference signal, indicates a voltage signal less than the reference signal and calculates the IDDQ based upon the number of periodic samples from the time power is removed from the integrated circuit and the voltage of the reference signal.

11 Claims, 6 Drawing Sheets

METHOD AND APPARATUS FOR DETERMINING IDDQ

BACKGROUND

The present invention is generally related to the testing of integrated circuits and more particularly related to the rapid functional testing and evaluation of the quality and current leakage of digital CMOS integrated circuits.

Integrated circuits (ICs) are regularly subjected to quality checks and performance evaluations following their manufacture. Since the quantity of devices is substantial, the testing is performed by automated equipment which has been optimized for throughput and accuracy. Examples of automated test equipment for IC manufacture are an HP83000 model F330 Digital IC Test System, available from Hewlett Packard Company and an S9000 Test System, models MX or FX available from Schlumberger, Inc. Generally, these types of test equipment are configured as shown in FIG. 1, in which the IC Test System 101 is coupled to a workstation 103 (or similar computer interface for automated programming of the IC Test System) and accepts an IC device under test (DUT) 105. The DUT can be an individual packaged IC or a wafer containing a multitude of IC dice or any stage of process between the two. In the HP 83000 Test System, a dedicated mainframe controller 107 controls the preprogrammed operations of the test equipment and directs a DUT Interface 109 to configure its resident hardware to source or receive signals to/from the DUT 105. Electrical and mechanical interconnection and attachment for the duration of the testing process is achieved by a DUT Interconnect board 111, which typically has 100 to 400 connection pins to temporarily connect to the pads or package pins of the DUT 105.

Since the DUT 105 is usually a digital device, a number of the DUT inputs are forced to logic levels established by the controlling program of the mainframe 107 during testing. Other of the IC outputs are monitored for the resulting logic level produced by the DUT in response to the forced logic levels. A determination of the logic state of the monitored outputs is made by the DUT Interface 109 and the results are analyzed and reported as pass/fail by the mainframe 107. Depending upon the test desired by the engineer, the test program can sequence through a number of cycles to test the operating performance of the DUT or to test static parameters of particular portions of the DUT.

One of the static, or quiescent, tests which is performed on an IC is that of quiescent current drain (IDDQ or ISSQ). One or more IDDQ monitors may be designed onto the DUT Interconnect III or designed into the circuitry of the IC to detect leakage of portions of the IC digital circuitry and to provide an overcurrent error when the quiescent current exceeds a predetermined value. See, for example, U.S. patent application Ser. No. 08/741,879, "Multiple On-Chip IDDQ Monitors", filed on Oct. 16, 1996, on behalf of Charles Allen Brown, and assigned to the assignee of the present invention. It has also been suggested (see, Keating et al., "A New Approach To Dynamic IDD Testing", Proc. 1987, Int'l Test Conf., IEEE CS Press, 1987, pp. 316–321; Wallquist et al., "A General Purpose IDDQ Measurement Circuit", Proc. 1993, Int'l Test Conf., IEEE CS Press, 1993, pp. 642–651; and Wallquist, "Achieving IDDQ/ISSQ Production Testing With QuiC-Mon", IEEE Design and Test of Computers, IEEE Press, Fall 1995, pp. 62–69.) that a Keating/Meyer circuit be used to test leakage of Ics. Such a test configuration will be called a Keating/Wallquist circuit hereinafter. A Keating/Wallquist circuit is shown in the diagram of FIG. 2 to test IDDQ and operates by placing the DUT 105 in a powered, quiescent (unclocked) state and subsequently removing the supply power from tester power supply 201 by opening switch 203. The intrinsic capacitance 205 of the DUT 105, the parasitic capacitance 207 of the interconnect to the DUT, and, perhaps, purposefully added capacitance (not shown) stores enough electric charge to maintain a voltage across the quiescent DUT. This voltage is monitored at the DUT for a decay in voltage magnitude as the internal impedance of the DUT IC bleeds off the charge. A defective IC (or an IC of marginal quality) experiences a relatively rapid decay of voltage while a good IC demonstrates a relatively slow decay of voltage.

Conventional IC Testing Systems, being designed for production line performance testing, provide rapid pass/fail results on a DUT but are not equipped to provide signal analysis of the kind needed to determine the Keating/Wallquist circuit decay waveform and to analyze circuit performance or defects indicated by the waveform. Thus, detailed analysis beyond pass/fail has not been practical. Furthermore, certain parasitic features of the testing interconnect to the DUT have yielded ambiguous results in the measured decaying voltage waveform.

SUMMARY OF THE INVENTION

An apparatus and method for measuring IDDQ of a device under test employs a circuit tester providing a power supply output from a power supply which supplies power to the device under test. A first switch couples the power supply output to the device under test. A monitor signal output is coupled to the device under test to enable monitoring of a decay signal. At least one processor opens the first switch and thereafter periodically samples the signal at the monitor signal output, compares the magnitude of the signal at the time of each periodic sample to a predetermined reference signal magnitude, indicates a threshold crossing when the comparison indicates a magnitude of the signal less than the reference signal magnitude, and calculates in response to the indication of threshold crossing, the value of IDDQ based upon the number of periodic samples from the time the first switch is opened and the signal.

DETAILED DESCRIPTION OF A PREFERRED EMBODIMENT

Figure 1:
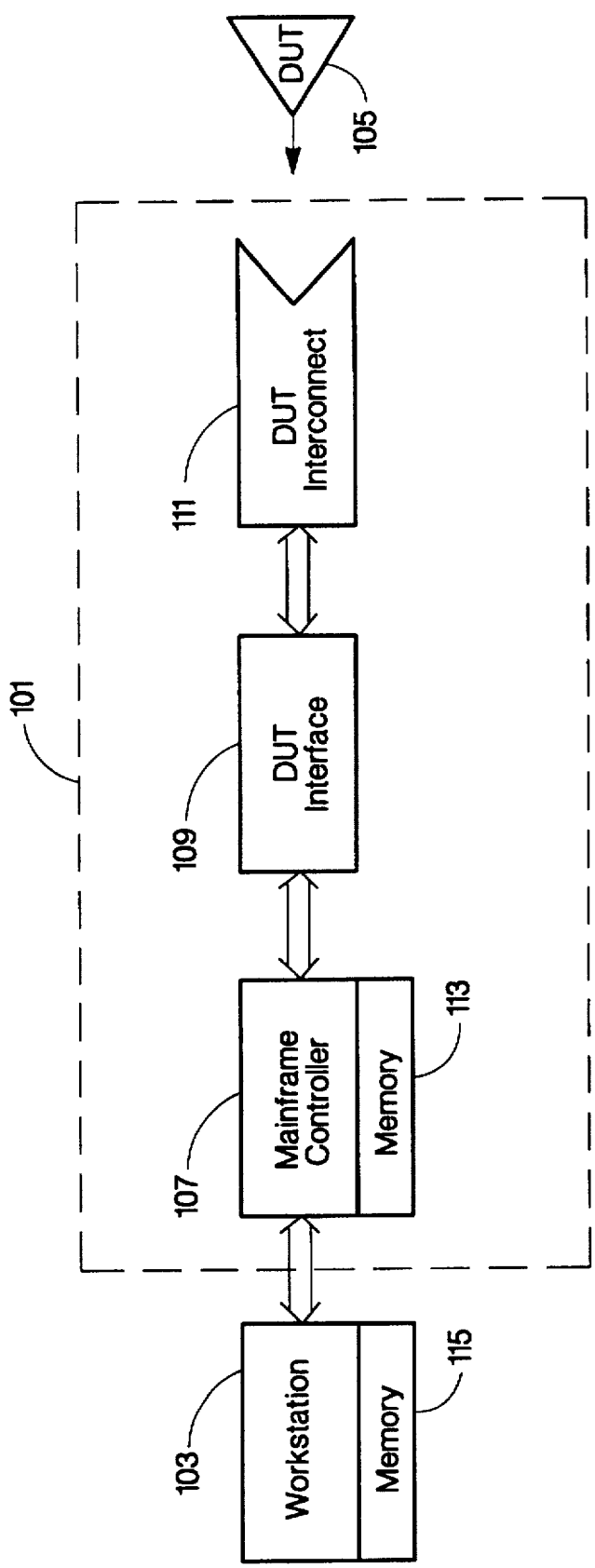
FIG. 1 is a block diagram of an integrated circuit tester which may employ the present invention.
Figures 2, 3:
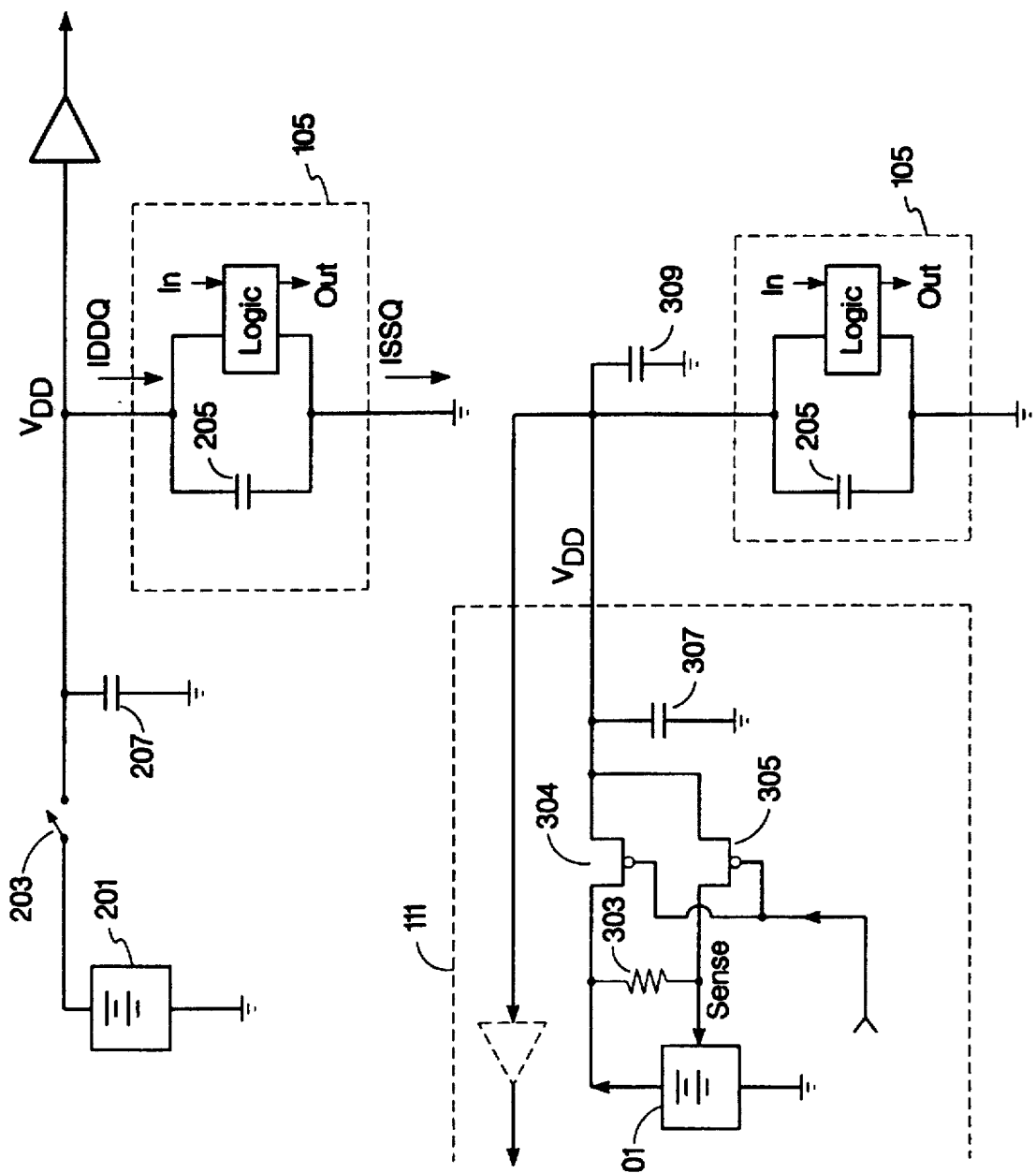
FIG. 2 is a block diagram of a Keating/Wallquist test circuit which may be employed in the present invention.
FIG. 3 is a block diagram of a Keating/Wallquist test circuit which may be employed in the present invention.

A preferred embodiment of the present invention employs an Hewlett-Packard Company HP83000 test system to accomplish rapid testing of CMOS integrated circuits. In order to provide detailed functional data from equipment which conventionally outputs pass/fail results, the preferred embodiment employs a version of a Keating/Wallquist circuit suitable to the present invention to sense the quiescent leakage current (IDDQ) of a CMOS logic circuit. The schematic of FIG. 3 illustrates the connection of the Keating/Wallquist circuit in the preferred embodiment. A power supply 301 is located on the DUT Interface 109 to provide operating power for the device under test 105 and samples the voltage $V_{DD}$ at the DUT. This sample is returned as a sense voltage to the power supply 301 by way of a sense line. In this way a very close tolerance can be maintained over the value of $V_{DD}$ thereby enabling precision testing of the DUT even at low supply voltages. A resistor 303 provides a coarse feedback to the sense line during periods when a $V_{DD}$ sample is not being returned to the power supply 301. Two field effect transistors 304 and 305 are located on the DUT Interconnect 111. Transistor 304 is connected in series with the power supply 301 and couples power to the device under test 105. This supplied power also charges a parasitic capacitor 309, a supplemental capacitor 307, and an intrinsic capacitor 205 of the device under test. The separate $V_{DD}$ sense line is returned to the power supply 301 via the series-coupled transistor 305. When the mainframe 107 signals its readiness to perform an IDDQ test, a signal is coupled to the gate of transistors 304 and 305 simultaneously so that both transistors are turned off. This switching of the transistors causes the cessation of supplying voltage to the DUT 105 and the disconnection of the sense voltage being returned to the power supply 301, respectively. It is a feature of the present invention that two switches, one in the power supply and one in the voltage sense return, are employed in an IDDQ test to provide a more accurate control of $V_{DD}$ when the transistors 304 and 305 are in the on state.

Once the transistors 304 and 305 are turned off, the power decay signal represented by the supply voltage, $V_{DD}$, applied to the device under test 105 is determined by the charge remaining in the parasitic capacitor 309, a supplemental capacitor 307 which may be added for ease of measurement, and the intrinsic capacitor 205. When an IDDQ measurement is made, the logic of the device under test 105 is placed in a predetermined but unclocked and quiescent state or set of states, such that only the DUT leakage current is being drawn. In a simplified analysis, this leakage current is drawn by the expected channel resistance ($R_C$), which is an unavoidable impedance related to the number of gates in the logic circuit and the particular processes used in the manufacture of the circuit, and a defect resistance ($R_D$) which is indicative of an undesirable defect such as gate oxide shorts. A first approximation to the performance of $V_{DD}$ after the removal of the power supply is the well known RC time constant exponential decay. There are, of course, additional complexities and non-linearities but generally these can be ignored for the period of time immediately following the removal of the power supply. In the preferred embodiment, $V_{DD}$ is coupled from the DUT to the DUT Interface 109 for processing and determination of IDDQ. In some instances, it may be desirable to provide additional buffering or amplification of the $V_{DD}$ performance so a buffer amplifier (shown in phantom) may be disposed on the DUT Interconnect 111.

As previously mentioned, conventional integrated circuit automated test equipment is designed for rapid pass/fail indications and is not generally equipped to provide analytical data such as an analysis of an RC time constant voltage decay. It is a feature of the present invention, however, that recognition of a detected pass/fail event (which may be a pass/fail test separate and independent of an IDDQ pass/fail test) following a predetermined number of test cycles can be processed to yield an approximation of the voltage decay waveform and from this approximation the IDDQ current value can be determined. In the preferred embodiment one or more of the tests programmed to be performed by the HP83000 test system is that of an IDDQ pass/fail. In this instance the test system is programmed to test for IDDQ pass/fail over a sequential number of cycles, each cycle equaling a predetermined amount of time (for example, in the preferred embodiment approximately 5 microseconds). It should be noted that since the test system can test in excess of 100 DUT test points at a given time, that an IDDQ and other leakage current measurements can be performed at the same time as other DUT parameters are measured. Nevertheless, the following discussion considers the measurement of leakage current in isolation but other measurements, including other IDDQ measurements, can be made at the same time.

Figure 4:
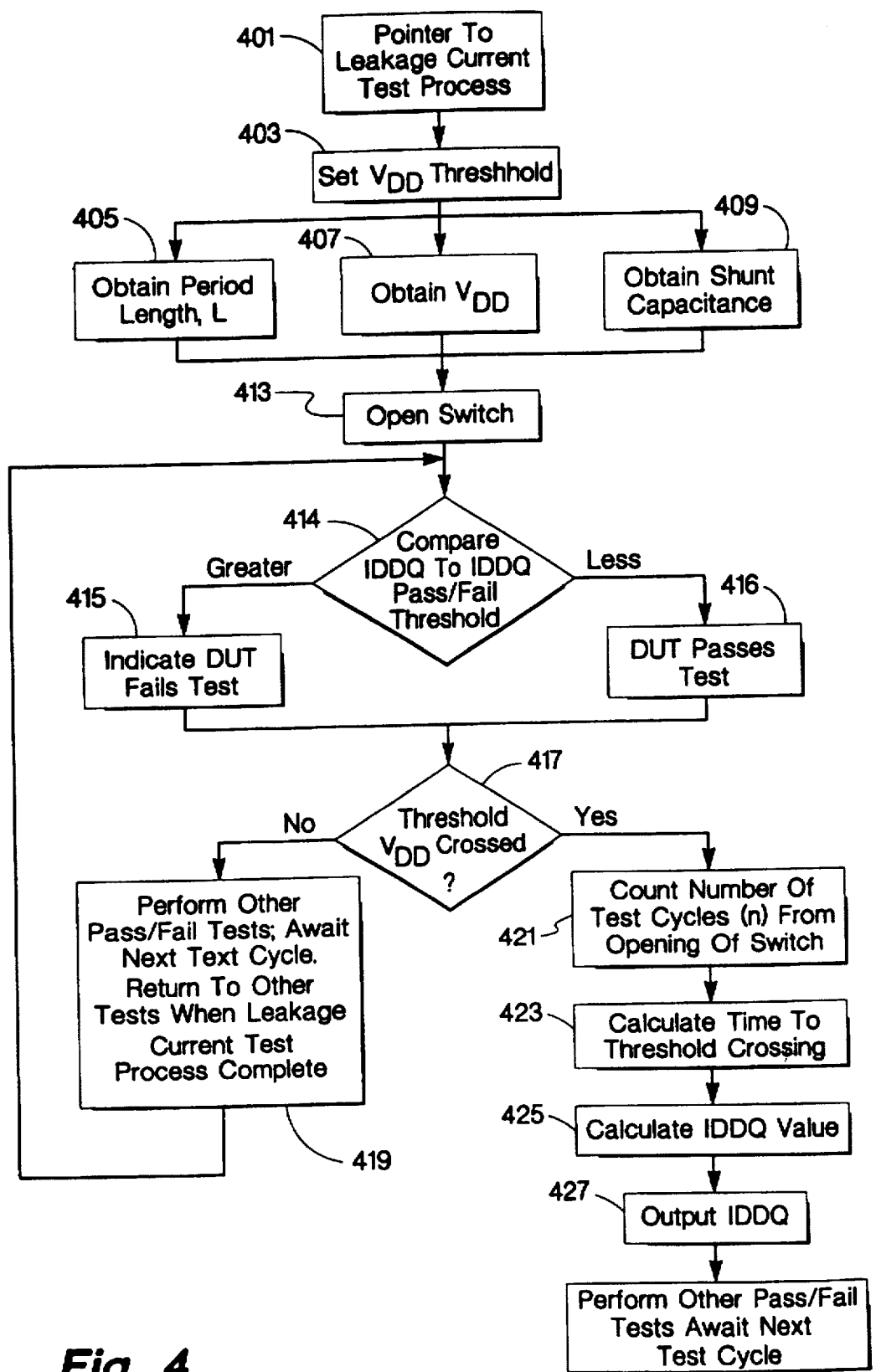
FIG. 4 is a flowchart of a process of determining IDDQ which may be employed in the present invention.

Referring now to FIG. 4, a process for the preferred embodiment to recover a functional measurement of leakage current performance from a pass/fail high speed measurement system is shown. While the workstation 103 is very capable and flexible, a dedicated use to directly control leakage current tests is relatively expensive. Therefore, in the preferred embodiment, the mainframe 107 is preprogrammed to test the drooping $V_{DD}$ in a succession of tester cycles. The test sample times are predetermined and downloaded from the workstation 103 to the mainframe 107. When the decaying $V_{DD}$ drops below a selected threshold, a failure is indicated starting at one of the test sample times.

Leakage current is tested following the placing of the DUT in an appropriate low power or quiescent state. In the preferred embodiment, a value of IDDQ leakage current is determined independently from a determination of IDDQ pass/fail while employing a pass/fail series of tests; that is, a DUT may not fail the conventional IDDQ test but its IDDQ value can be determined by continuing the sampling of the decaying $V_{DD}$ until it drops below another predetermined voltage threshold for which IDDQ characteristics are known. These characteristics can be DUT 105 and DUT Interconnect 111 resistances and capacitances which have been previously determined from prior measurement and device samples at the predetermined voltage threshold. These characteristics can also be a measured family of $V_{DD}$ decay voltage curves which have been previously correlated to specific IDDQ current values. Either IDDQ determination method may be employed in alternate embodiments.

When an IDDQ determination is to be performed, the program experiences a pointer, 401, from the workstation 103 to the test process which defines, among other things, the IDDQ test. The process may be distributed between the workstation 103, the mainframe 107, and the DUT Interface 109 as the designer deems most optimum. In general, the preferred embodiment assigns calculation steps to the workstation. Since this particular IDDQ test is likely to be one of many IDDQ tests to be run by the entire test suite of the test system, a $V_{DD}$ threshold limit is set at step 403. It should be noted that this limit can be (and in the preferred embodiment is) different from a limit equated to a determination of a failed DUT due to an excessive IDDQ value. Three other parameters obtaining the period length, L, (step 405), obtaining the supply voltage, $V_{DD}$, (step 407), and obtaining the shunt capacitance of the intrinsic capacitor, the parasitic capacitor, and any purposefully added supplemental capacitors (step 409). Transistors 304 and 305 are placed in the off (open) state at step 413. A determination of whether the conventionally established IDDQ device failure current is made at steps 414, 415, and 416. A determination of whether the previously established $V_{DD}$ threshold has been crossed is made at a comparison step 417. Since the $R_C$ time constant is related to IDDQ, a selected voltage after a given amount of time can be related to the leakage current of the DUT.

Figure 5:
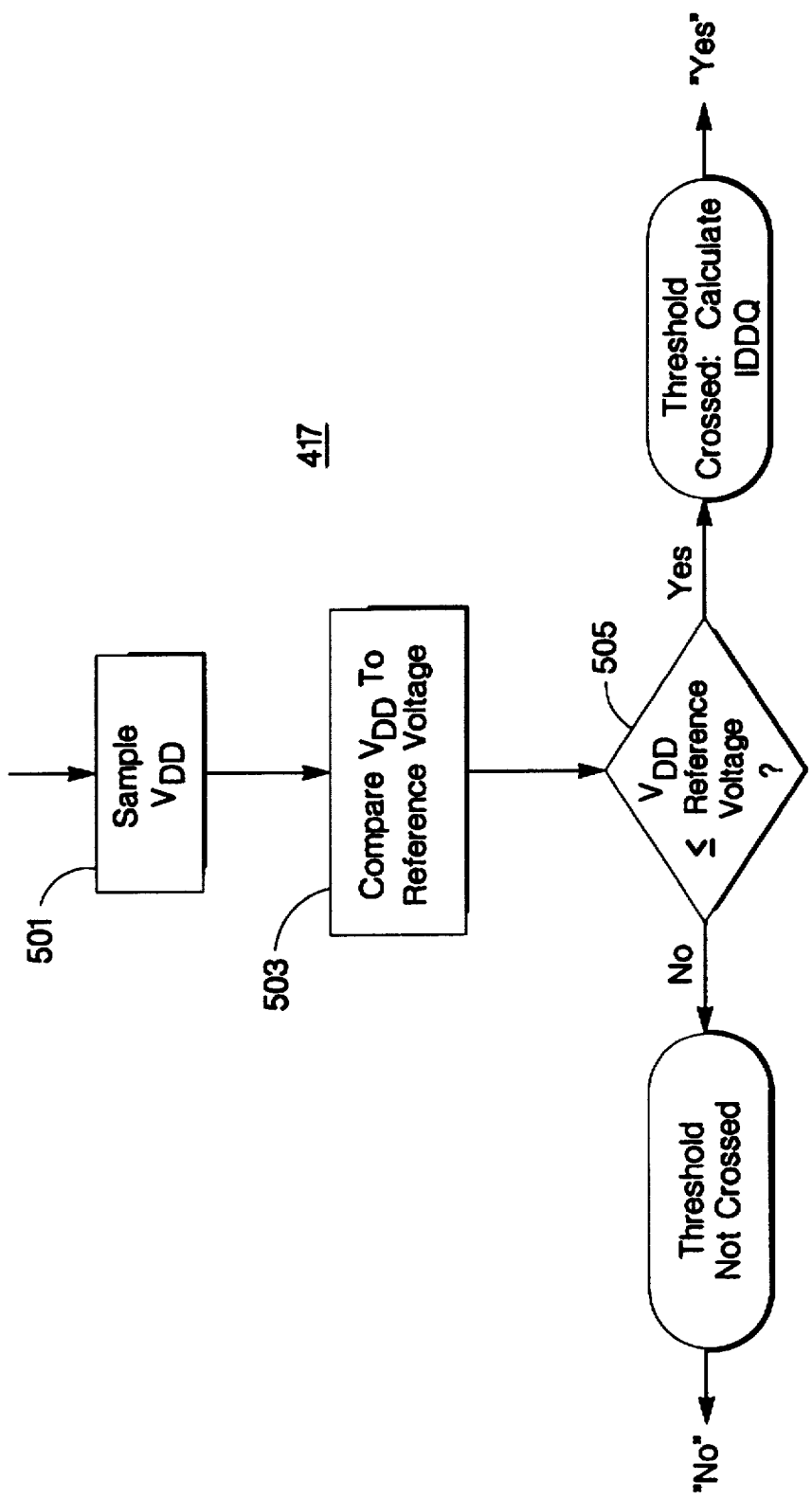
FIG. 5 is a flowchart of the process of determining whether the predetermined $V_{DD}$ threshold has been crossed and may be employed in the present invention.

The comparison step 417 employed in the preferred embodiment is shown in FIG. 5. The $V_{DD}$ voltage magnitude is sampled at step 501. A $V_{DD}$ magnitude greater than the threshold voltage magnitude does not trigger a calculation of IDDQ while a measured $V_{DD}$ less than the threshold voltage magnitude initiates the calculation of IDDQ. This comparison and determination is shown in steps 503 and 505. While a pass/fail result is obtained, a further process yields a value for IDDQ. If the result from the comparison step 417 shows that the threshold voltage has not been crossed ("N"), the process moves to step 419 to allow other pass/fail tests to be performed during the present test cycle. If the leakage current test process is complete, the mainframe will progress to another series of programmed test. If not, the next test cycle is awaited and another threshold limit test is made at step 417.

If the threshold voltage has been crossed ("Y") at step 417, a calculation of the time to such crossing is made at step 423. A count of the number of test cycles, N, since the opening of the switch is made at step 421. The length of the period, L, is multiplied by the number of test cycles to yield a total time, t. In a first alternative of the preferred embodiment, the value of IDDQ is calculated at step 425 by using the following formula:

$$IDDQ = -C \frac{\Delta V}{\Delta t} - \frac{V_{DD}}{R_C}$$

which is derived from the leakage current through the defect resistance ($R_D$) device under test:

$$IDDQ = \frac{V_{DD}}{R_D}$$

when the switches 304 and 305 are closed, the current into the DUT 105, its intrinsic capacitance 205, and associated parasitic capacitance 309, and supplemental capacitance 307 is given by:

$$I = \frac{V_{DD}}{R_C} + \frac{V_{DD}}{R_D} + (C + C_D) \frac{dV}{dt}$$

where $R_C$ is the DUT channel resistance (which is known from previous characterizations of other DUTs), $R_D$ is the DUT defect resistance, $C_D$ is the intrinsic capacitance of the DUT, and C is the total shunt capacitance, including the parasitic capacitance and supplemental capacitance. Since the individual designing the IDDQ test may choose the voltage at which the leakage current calculation is made, the difference between the power supply voltage $V_{DD}$ and the reference 503 selected by the designer can be made small so that:

$$\Delta V \ll V_{DD}$$

If this is so, $$\frac{dV}{dt} \approx \frac{\Delta V}{\Delta t}$$

and $\Delta t$ is a result of the calculation of step 423. To further simplify the leakage current calculation, the total shunt capacitance can be made significantly larger than the intrinsic capacitance:

$$C_D \ll C$$

Thus, when the switches 304 and 305 are opened, $$0 = \frac{V_{DD}}{R_C} + \frac{V_{DD}}{R_D} + C \frac{\Delta V}{\Delta t}$$

From this calculation the value of IDDQ is output at step 427 and the process moves to the next test process.

Figure 6:
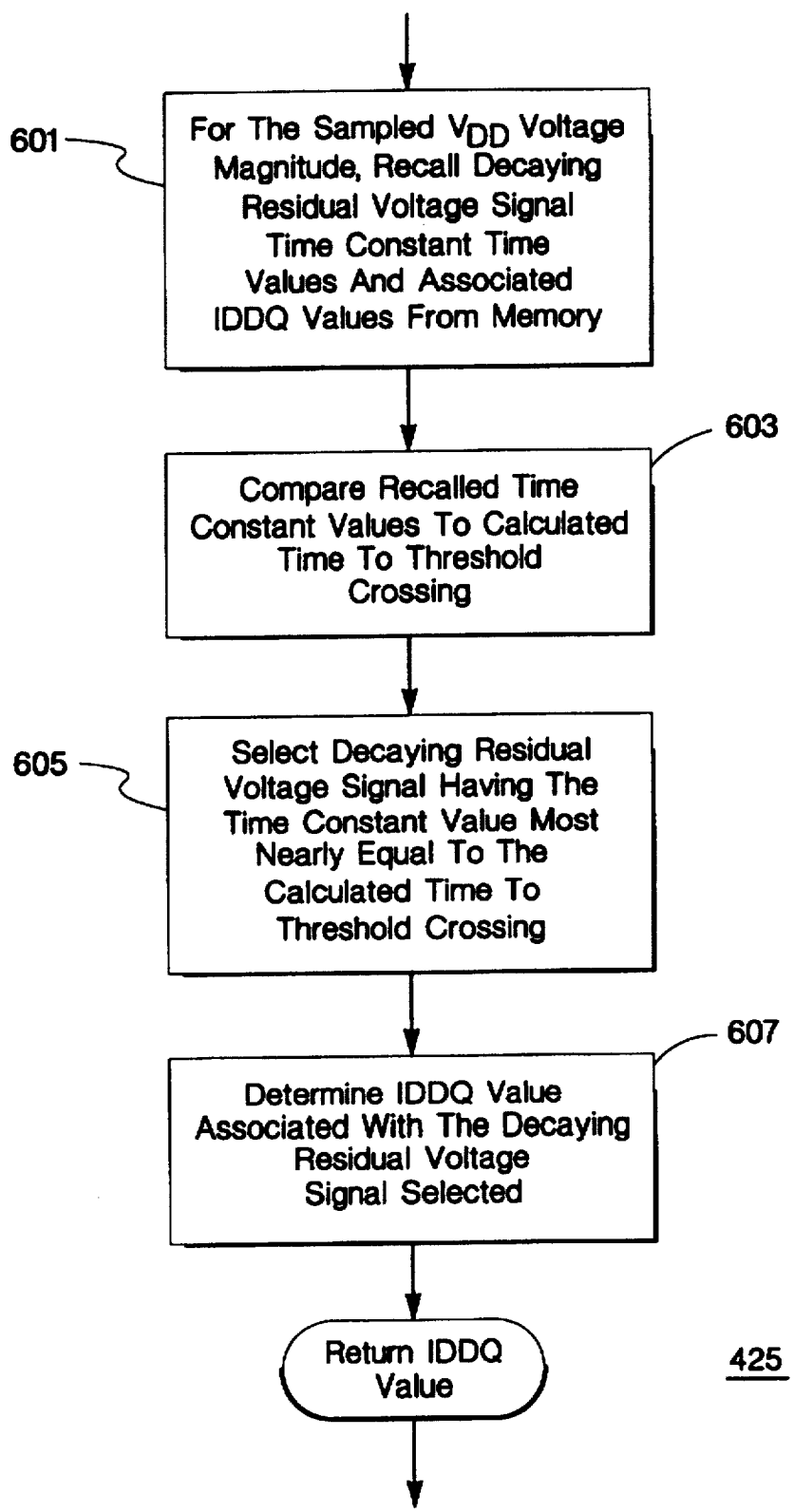
FIG. 6 is a flowchart of the process of calculating a value of IDDQ which may be employed in the present invention.
Figure 7:
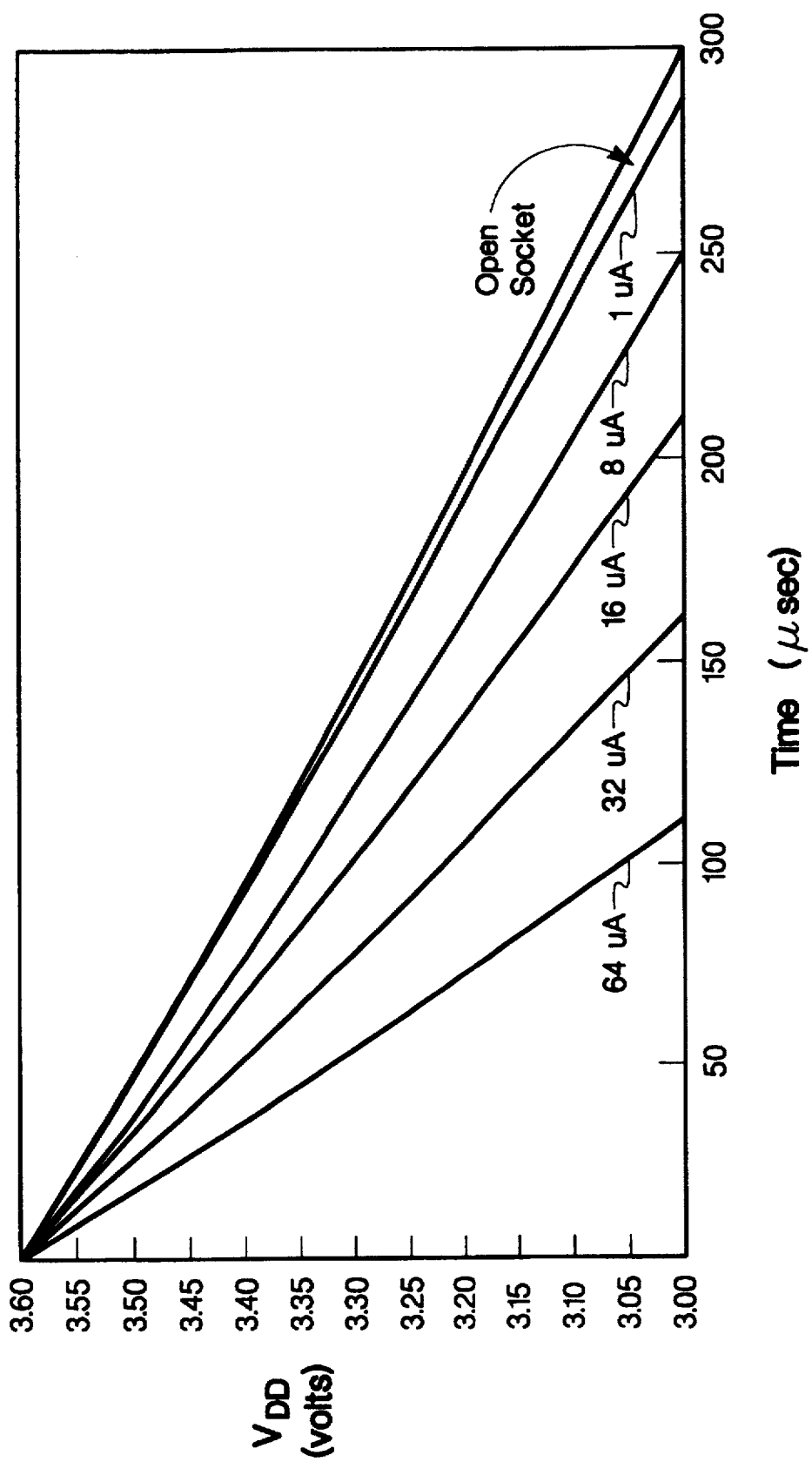
FIG. 7 is a $V_{DD}$ versus time graph showing residual voltage decay waveforms which may be useful in the present invention.

In a second embodiment, a family of decaying residual DUT voltage curves related to time and derived from previous measurements of sampled DUTs (with known values of shunt capacitance) is stored in a memory 113,115 which may be part of the mainframe controller 107 or the workstation 103. When a measured value of voltage is provided from a sample, the time relating to each of the decaying residual voltage signals at this sample voltage are returned from the memory at step 601 of FIG. 6. The recalled time values are compared, at step 603, to the time to threshold crossing which was calculated at step 423. The related residual voltage curve for which the recalled time value is found closest to the actual sampled time period is deemed representative of the residual voltage decay waveform, at step 605. The IDDQ value which is related to the representative residual voltage curve is selected as the actual IDDQ value at step 607. Referring to FIG. 7, a family of decaying residual voltage curves is shown for IDDQ values of 64 μA, 32 μA, 16 μA, 8 μA, 1 μA, and open socket (no DUT installed in the DUT Interconnect 111 ). When a measurement of $V_{DD}$ equals 3.30 volts, for example, the memory returns the values of time corresponding to each residual voltage curve, ie. 50 μsec for the 64 μA curve, 75 μsec for the 32 μA curve, 100 μsec for the 16 μA curve, etc. If the time elapsed, based upon the number of test cycles, is 100 μsec, the present invention deems the value of IDDQ to be 16 μA and this is the value provided for IDDQ analysis.

Thus, by employing the present invention, a rapid pass/ fail test system will provide more detail regarding the value of IDDQ than mere pass/fail.

We claim:
1. An apparatus for determining an IDDQ value of a device under test comprising:
   a circuit tester providing a power supply output from a power supply, said power supply output providing power to the device under test;
   a first switch which couples said power supply output to said device under test when closed;
   a monitor signal output, coupled to the device under test whereby a decay signal is monitored; and
   at least one controller which opens said first switch and thereafter periodically samples said decay signal at said monitor signal output, compares the magnitude of said decay signal at the time of each said periodic sample to a predetermined reference signal magnitude, indicates threshold crossing when said comparison indicates a magnitude of said decay signal less than said reference signal magnitude, and, in response to said indication of threshold crossing, calculates the value of IDDQ based upon the number of periodic samples from said opening of first switch and said decay signal.

2. An apparatus for determining an IDDQ value in accordance with claim 1 further comprising a sense signal input at said power supply and a second switch coupled to the device under test and to said sense signal input of said power supply when closed and responsive to said controller to open when said first switch is opened.

3. An apparatus for determining an IDDQ value in accordance with claim 1 wherein said at least one controller further comprises a memory for storing at least one decay signal versus time relationship associated with an IDDQ value.

4. An apparatus for determining an IDDQ value in accordance with claim 2 wherein said first and second switches each further comprise a transistor and wherein a gate of each said transistor is connected together.

5. An apparatus for determining an IDDQ value in accordance with claim 1 wherein said decay signal further comprises a voltage.

6. A process of determining an IDDQ value of a device under test comprising the steps of:

providing a power supply output signal from a power supply;

coupling said power supply output signal to the device under test via a first switch;

opening said first switch thereby disconnecting said power supply output signal from the device under test;

periodically sampling the magnitude of a decay signal indicative of power decay from said device under test after said first switch is opened;

comparing at least one of said periodically sampled decay signal magnitudes to a predetermined reference signal magnitude;

indicating a threshold crossing when said comparison step indicates a magnitude of said decay signal less than said reference signal magnitude;

calculating the value of IDDQ, in response to said indicated threshold crossing, based upon the number of periodic samples from said opening of first switch and said decay signal.

7. A method in accordance with the method of claim 6 wherein said calculating step further comprises the steps of:

determining the amount of time between each periodic sampling;

counting the number of periodic samples occurring from the time following the opening of said first switch; and multiplying said determined amount of time between each periodic sampling by the counted number of periodic samples to yield the magnitude of the total time period from said opening of said first switch and said indication of said threshold crossing.

8. A method in accordance with the method of claim 7 wherein said step of calculating the value of IDDQ further comprises the steps of:

obtaining a first magnitude of said decay signal before said opening of said first switch;

determining an amount of capacitance shunting the device under test when said first switch is open;

calculating a difference between said first magnitude and at least one magnitude of said periodically sampled decay signal;

multiplying said calculated difference by said determined amount of capacitance and dividing by said magnitude of the total time period thereby establishing a first current; and combining said first current with the current drawn by the channel resistance of the device under test.

9. A method in accordance with the method of claim 7 wherein said step of calculating the value of IDDQ further comprises the steps of:

for said sampled magnitude of said decay signal, recalling from a memory at least one decay signal curve time value and associated IDDQ value of a plurality of stored decay curve time values and associated IDDQ values;

comparing said recalled time value to said total time period;

determining as said IDDQ value said associated IDDQ value when said comparison step indicates said recalled decay curve time value is more nearly equal to said total time period than any other of said plurality of stored decay curve time values.

10. A method in accordance with the method of claim 6 further comprising the steps of:

coupling a sense signal equal to said power supply output signal to a sense input of said power supply via a second switch; and opening said second switch essentially simultaneously with said first switch thereby disconnecting said sense signal from said power supply.

11. A method in accordance with the method of claim 7 further comprising the step of determining device under test failure for excessive IDDQ.

* * * * *